(12) United States Patent
Lechner

(10) Patent No.: US 7,764,796 B2
(45) Date of Patent: Jul. 27, 2010

(54) SIGNAL STRENGTH INFORMATION DEPENDENT CONTROL OF SMALL ELECTRODYNAMIC TRANSDUCERS IN AUDIO SYSTEMS

(75) Inventor: Thomas Lechner, Kirchheim (DE)

(73) Assignee: Sony Ericsson Mobile Communications AB, Lund (SE)

( * ) Notice: Subject to any disclaimer, the term of this patent is extended or adjusted under 35 U.S.C. 154(b) by 990 days.

(21) Appl. No.: 10/522,857

(22) PCT Filed: May 28, 2003

(86) PCT No.: PCT/EP03/05648

§ 371 (c)(1),
(2), (4) Date: Sep. 26, 2005

(87) PCT Pub. No.: WO2004/016040

PCT Pub. Date: Feb. 19, 2004

(65) Prior Publication Data

US 2006/0153403 A1 Jul. 13, 2006

(30) Foreign Application Priority Data

Aug. 5, 2002 (EP) .................................. 02017613

(51) Int. Cl.
*H04R 29/00* (2006.01)
(52) U.S. Cl. .............................. 381/59; 381/56; 381/103
(58) Field of Classification Search ................... 381/98, 381/102, 103, 104, 107, 58, 59, 56, 57
See application file for complete search history.

(56) References Cited

U.S. PATENT DOCUMENTS 4,109,107 A * 8/1978 Boast .......................... 381/103

(Continued)

FOREIGN PATENT DOCUMENTS

GB 2 315 378 1/1998

(Continued)

OTHER PUBLICATIONS

International Search Report for PCT/EP03/005648.

(Continued)

*Primary Examiner*—Vivian Chin
*Assistant Examiner*—Jason R Kurr
(74) *Attorney, Agent, or Firm*—Myers Bigel Sibley & Sajovec

(57) ABSTRACT

A control circuit for a signal strength information dependant frequency response adaptation of an audio signal for an electrodynamic transducer, with a signal strength information determinator for determining a signal strength information according to a level of the audio signal, and a frequency modifier for frequency selectively modifying the audio signal in response to the signal strength information. The electrodynamic transducer converts the audio signal into a low distortion sound signal for high levels of an audio signal and has a flat frequency response for low levels of an audio signal. A lower frequency range of the audio signal is modified with a gain that is different to a gain of a higher frequency range of the audio signal. A frequency separating the lower frequency range from the higher frequency range is shifted towards higher values for an increasing level of the audio signal and towards lower values for a decreasing level of the audio signal. A mobile telecommunication terminal can include an accordingly designed control circuit.

27 Claims, 6 Drawing Sheets

U.S. PATENT DOCUMENTS

| | | | | |
|---|---|---|---|---|
| 4,490,585 | A | * 12/1984 | Tanaka | 379/52 |
| 4,736,426 | A | * 4/1988 | Kinoshita et al. | 381/1 |
| 4,837,832 | A | 6/1989 | Fanshel | 381/68.4 |
| 5,029,238 | A | 7/1991 | Gehr | 455/222 |
| 5,278,912 | A | 1/1994 | Waldhauer | |
| 5,285,502 | A | * 2/1994 | Walton et al. | 381/94.2 |
| 5,577,126 | A | * 11/1996 | Klippel | 381/59 |
| 6,198,830 | B1 | 3/2001 | Holube et al. | |
| 7,016,509 | B1 | * 3/2006 | Bharitkar et al. | 381/98 |
| 7,184,556 | B1 | * 2/2007 | Johnson et al. | 381/61 |
| 7,483,540 | B2 | * 1/2009 | Rabinowitz et al. | 381/103 |

FOREIGN PATENT DOCUMENTS

| | | |
|---|---|---|
| JP | 3-8669 | 1/1991 |
| JP | 6-189389 A | 7/1994 |

OTHER PUBLICATIONS

International Preliminary Examination Report for PCT/EP03/05648.

* cited by examiner

SIGNAL STRENGTH INFORMATION DEPENDENT CONTROL OF SMALL ELECTRODYNAMIC TRANSDUCERS IN AUDIO SYSTEMS

RELATED APPLICATIONS

The present application is a 35 U.S.C. §371 national phase application of PCT International Application No. PCT/EP03/005648, having an international filing date of May 28, 2003 and claiming priority to European Patent Application No. 02017613.7, filed Aug. 5, 2002, the disclosures of which are incorporated herein by reference in their entireties. The above PCT International Application was published in the English language and has International Publication No. WO 04/016040.

FIELD OF THE INVENTION

The present invention relates to a reproduction of voice and audio signals on devices with audio systems using small electrodynamic transducers and which are particularly able to reproduce audio frequency signals within a high dynamic range.

BACKGROUND OF THE INVENTION

Electrodynamic transducers or electrodynamic speakers, respectively, are used in many, particularly mobile appliances, like for instance portable radios or playback equipment as e.g. mp3-players, small disk players or pocket sized tape players but also in mobile telecommunication terminals like e.g. mobile phones, personal digital assistants or the like for an implementation of a variety of acoustic functions like for instance voice or audio data transmission or a generation of certain signalling tones. As mobile appliances are continuously subject to miniaturisation, the available space left for integrating a speaker is also shrinking continuously. Acoustic engineers will therefore seek for electrodynamic transducers or speakers, respectively, with continuously smaller membrane area and/or reduced thickness.

For most small loudspeakers, the circumference of the membrane is significantly smaller than the wavelength of the sound produced by the speaker at least in the lower audio frequency range. To compensate for the resulting impairment of the transducing efficiency at lower frequencies, the membrane velocity has to be increased inversely proportional with decreasing frequency. A uniform transducing efficiency can thus be obtained within the complete frequency range of a respective electrodynamic loudspeaker.

To this effect, the membrane resonant frequency of an electrodynamic transducer is set close to the lower end of the frequency range to be transduced, and the electrodynamic loudspeaker is operated with a constant voltage drop across its coil impedance. The latter requirement can easily be accomplished by operating the speaker with a low output impedance audio circuit. The combined inertial mass of the membrane, the coil of the speaker, and the moved air will thus be driven with a more or less constant force.

When being operated with a frequency independent constant voltage drop, the oscillation amplitude of the electrodynamic transducer membrane is inversely proportional to the square of the signal frequency. High membrane oscillation amplitudes at low frequencies have to be expected for this operation mode. If the oscillation amplitude of the membrane exceeds a certain limit, an electrical audio frequency signal will not be transduced properly into a respective sound signal, but distortions and clipping will occur. Sometimes, the speaker would even be damaged. The level allowed for audio frequency signals at low frequencies is therefore limited by the maximum oscillation amplitude of the speaker membrane. It is to be noted, that the explained applies particularly also to mobile telecommunication terminals with leak tolerant as well as to those with a not leak tolerant design of an acoustic cabinet for an electrodynamic transducer. Where applicable in the further description, the abbreviation 'audio signal' will be used for a denomination of an audio frequency signal usually in an electrical form.

The overall efficiency of an electrodynamic transducer is strongly correlated with the size of its membrane area. Larger membrane areas yield a higher efficiency than smaller ones. To improve the efficiency of a given electrodynamic speaker with a respectively small membrane area, the membrane and its suspension have to be engineered for a scaled-up oscillation amplitude. The usual requirement of designing an electrodynamic speaker as thin as possible sets a certain limit to respective development trends. For a given signal with a given spectrum, the sound pressure achievable with a thin and small electrodynamic transducer is therefore limited by the small range allowed for membrane oscillation amplitudes.

Improvements of the transducing efficiency can be achieved by reducing the inertial mass of a speakers moving parts which are formed by the membrane, the driving coil, and the suspension. As the stiffness of the membrane suspension cannot be reduced below a certain limit, speakers designed for a high dynamic range, i.e. a high range in sound volume, usually have an exceptionally high membrane resonant frequency thus raising the lower limit frequency of the transducing frequency response.

An acoustic engineer seeking for a good sound quality and a high dynamic range for an acoustic speaker of a small acoustic system like e.g. that of a mobile telecommunication device therefore has to find a compromise between lowering the resonant frequency for an improvement of the sound quality and raising the resonant frequency for an extended dynamic range.

EP 0 071 845 B1 proposes an audio system for a hearing aid which splits the audio signal into several channels, amplifies the signal of each channel individually, and combines the thus processed individual signals for being transduced by a small loudspeaker. The improvement in sound quality achieved is obtained by a high complexity of the circuitry as separate filters and amplifiers are required for each channel.

The same drawback has to be stated for the system proposed in WO 94/23 548. In addition to EP 0 071 845 B1, the system defines two thresholds for the output signal of each channel, the gain of which is increased for the output signal falling below the lower threshold value defined and reduced for the output signal exceeding the higher threshold value defined.

U.S. Pat. No. 4,739,514 and U.S. Pat. No. 5,361,381 superimpose to an original audio signal an amplified lowpass filtered signal of the same origin to boost the bass frequency range of the audio signal. The relative boost of the bass frequency range varies with the strength of the audio signal. It is high for low signal levels and low for high signal levels for to compensate for the low sensitivity of the human hearing for bass frequencies at low sound pressures. The proposed system is designed for high power speaker systems which use membranes of sufficient size to transduce audio signals with high levels in the lower frequency region. U.S. Pat. No. 5,361,381 applies the said to the woofer of a loudspeaker system only.

SUMMARY

The object of the present invention instead is to provide a good sound quality and a high dynamic range for sound signals produced by an audio system with just one small electrodynamic transducer.

The above object is achieved by the invention as defined in the independent claims.

In particular, the above object is achieved by a control circuit for a signal strength information dependent frequency response adaptation of an audio signal for an electrodynamic transducer with a signal strength information determination means for determining a signal strength information according to the level of the audio signal, and a modifying means for frequency selectively modifying the audio signal in response to the signal strength information such, that the electrodynamic transducer converts the audio signal into a low distortion sound signal for high levels of an audio signal and with a flat frequency response for low levels of an audio signal, whereby a lower frequency range of the audio signal is modified with a gain different to a gain of a higher frequency range of the audio signal, and a frequency separating the lower frequency range from the higher frequency range is shifted towards higher values for an increasing level of the audio signal and towards lower values for a decreasing level of the audio signal.

The above object is further achieved by a method for a signal strength information dependent frequency response adaptation of an audio signal for an electro-dynamic transducer, comprising a step for determining a signal strength information according to the level of the audio signal, and a step for frequency selectively modifying the audio signal in response to the signal strength information such, that the electro-dynamic transducer converts the audio signal into a low distortion sound signal for high levels of an audio signal and with a flat frequency response for low levels of an audio signal, whereby a lower frequency range of the audio signal is modified with a gain different to a gain of a higher frequency range of the audio signal, and a frequency separating the lower frequency range from the higher frequency range is shifted towards higher values for an increasing level of the audio signal and towards lower values for a decreasing level of the audio signal.

The above object is further achieved by a computer software product for use on an audio system, implementing a control circuit according to the present invention by processing a method according to the present invention when being stored in a storage means and being executed by a processing means of the audio system.

Further, the above object is a achieved by a mobile telecommunication terminal comprising a control circuit according to the present invention or a storage means and a processing means for executing a computer software product according to the present invention for a level dependent frequency selective adaptation of an audio signal to the electro-mechanical properties of an electrodynamic transducer operated by the mobile terminal.

The present invention allows to advantageously adapt the frequency response of an audio signal to the electro-mechanical properties of a small electrodynamic transducer by not only weighting the lower and the higher frequency ranges of a signal differently, but by adaptively adjusting the limit frequency separating the lower from the higher frequency range according to a signal strength information of an audio signal being transduced.

Further developments of the present invention are set forth in the dependent claims.

Shifting the limit frequency separating the lower from the higher frequency range is effectively accomplished by modifying means comprising a high pass filter with a cut-off frequency being shifted towards higher frequencies for increasing levels of the audio signal and being shifted towards lower frequencies for decreasing levels of the respective audio signal.

An audio signal strength information is favourably being determined from a volume setting on the mobile telecommunication terminal allowing an implementation of the present invention with less complexity. Alternatively, the audio signal strength information can be determined from a current amplitude or from a current energy content of the audio signal as a whole, so that the modifying means is able to react to the actually present signal strength information. As the risk of overstraining an electrodynamic transducer is particularly relevant for the lower frequency range of an audio signal, the level of an audio signal may in a preferred embodiment of the present invention be determined from a current amplitude or from a current energy content of a lower frequency range of the audio signal.

The cut-off frequency of the high pass filter is preferably shifted proportional to the square root of the audio signal peak amplitude or is shifted proportional to the square root of the root mean square value of the audio frequency signal to compensate for the membrane behaviour, the oscillations amplitude of which changes proportional to the square of the level of the audio signal at low frequencies.

To achieve a flat frequency response particularly for higher level audio signals, the modifying means may further be implemented with a frequency range selective gain control for decreasing the gain of a higher frequency range of the audio signal corresponding to a decrease in the level of the audio signal, which is particularly useful in combination with electrodynamic transducers showing a relatively high mechanical resonance frequency.

The modifying means is preferably equipped with a frequency range selective gain control for decreasing the gain of the lower frequency range of the audio signal corresponding to an increase in the level of the audio signal. In this way, a lower edge frequency can be used without endangering the electrodynamic transducer, and further, the lower frequency signal range is still present even at a reduced level resulting in an improved sound quality.

The modifying means may further be implemented with the gain in the lower frequency range of the audio signal being independent of the volume setting, thus allowing a treatment of the low frequencies independent of a user control. The gain for the lower frequency range of the audio signal may hereby be kept at a constant value or may decrease for a increasing level of the audio signal, whereby the gain for the lower frequency range may preferably be higher than that for the higher frequency range of the audio signal.

To achieve a precise adaptation of the frequency response of an audio signal with respect to the transducing characteristic of an electrodynamic transducer, a level of the audio signal strength information is determined according to the electro-mechanical properties of the electrodynamic transducer.

For an effective adaptation to the oscillation behaviour of the membrane of an electrodynamic transducer, the cut-off steepness of a filter and/or of a frequency range progresses approximately with the square of the frequency.

BRIEF DESCRIPTION OF THE DRAWINGS

In the following description, the present invention is explained in more detail with respect to special embodiments and in relation to the enclosed drawings, in which.

DETAILED DESCRIPTION OF EMBODIMENTS OF THE INVENTION

Figure 1:
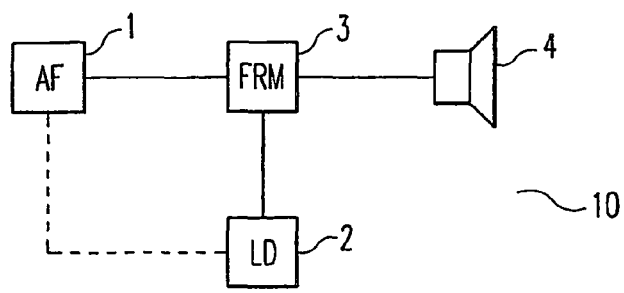
FIG. 1 is a block diagram illustrating the logical arrangement of a system according to the invention.

With reference to FIG. 1, there is shown a block-schematic diagram illustrating the logical arrangement allowing an adaptation of an audio signal frequency response based on a signal strength information derived from the level of an audio signal to the transducing characteristic of an electrodynamic transducer. An audio signal is provided by the audio frequency (AF) signal source 1 of a respective appliance like e.g. a mobile telecommunication terminal for being modified with respect to its frequency response in a modifying unit 3 before being supplied to a loudspeaker 4. A level determination unit 2 is connected to a control port of the modifying unit 3 for allowing an adaptation of the frequency response modifications to the level of the AF signal. The adaptation of the frequency response is typically effected by a gain control unit implemented within the modifying unit 3, which transforms the signal strength information into a frequency range selective gain of the modifying unit 3. The level determination may be based on a user setting or as indicated by the dashed line in FIG. 1 on a direct evaluation of the audio signal itself.

As the oscillation amplitude of the membrane is related proportional to the inverse of the square of the signal frequency, the risk of overstraining the membrane is particularly present for the lower frequency range of an AF signal. To prevent any signal distortion when transducing the AF signal or even possible damage to the transducer itself, the frequency components in the lower frequency range of the audio signal must therefore not exceed a certain level. For voice transmission in telephones, a frequency range from 300 to 3.400 $s^{-1}$ is typically required. For music transmission, this frequency range is typically extended to higher frequencies. The diameter of electrodynamic transducers which are used in mobile telecommunication terminals typically measures around 10 to 20 mm. These transducers allow to set the resonant frequency of the membrane to values from around 500 $s^{-1}$ up to $2 \cdot 10^3$ $s^{-1}$. While an electrodynamic transducer with a resonant frequency of the membrane of around 500 $s^{-1}$ shows a sufficient sound quality but at a low dynamic range, a transducer with a resonant frequency around $2 \cdot 10^3$ $s^{-1}$ shows a poor sound quality but provides a high dynamic range. Exceeding the signal intensity tolerable for an electrodynamic transducer with a low value of its resonant frequency beyond the limit given by the maximum signal intensity allowed at lower frequencies around the resonant frequency will reproduce a distorted or clipped sound signal. It is therefore desirable to attenuate the frequency components of an AF signal relative to its higher frequency components at high levels of an AF signal. For low enough levels of an audio signal, no risk of overstraining the transducer is given, so that the full frequency range of the transducer can be used giving a flat frequency response.

Figure 2:
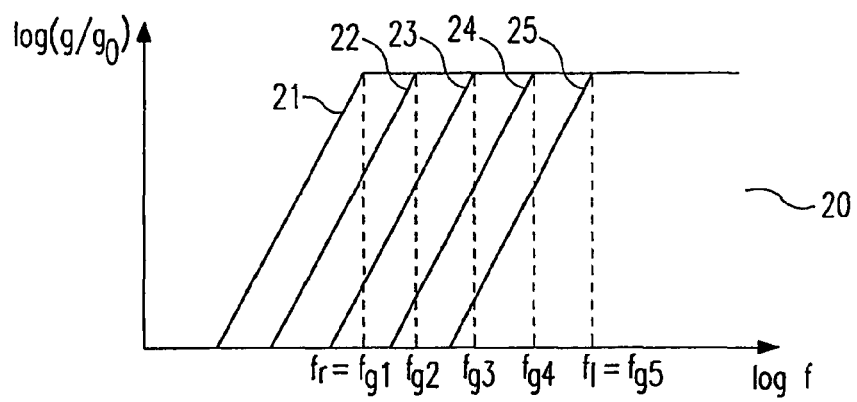
FIG. 2 is a graphical representation of a family of frequency responses of a high pass filter with a relocatable cut-off frequency.

A high pass filter, the cut-off frequency of which is shifted to higher frequencies for increasing levels of a respective audio signal, can be used to this effect. The shift of the cut-off frequency can be effected continuously or in discrete steps. In FIG. 2, a family of frequency response curves showing the relative gain of a respective high pass filter versus the frequency is shown. For low level audio signals, the cut-off frequency of the high pass filter is more or less identical with the resonant frequency $f_r$ of the electrodynamic transducer used, or even lower (see line 21). For the level of an AF signal approaching a certain critical limit, the cut-off frequency is shifted to higher values (lines 22, 23, 24) up to a limit frequency $f_l$ (line 25) which ensures that the membrane of the electrodynamic transducer 4 will not be overloaded. The risk of overloading the membrane decreases rapidly with increasing frequency due to the inversely proportional relation between the oscillation amplitude of the membrane and the square of the AF signal frequency. An upper limit for the cut-off frequency $f_l$ can therefore be set.

Further, the cut-off frequency of the high pass filter is shifted preferably proportional to the square root of the level of an AF signal for exactly compensating the membrane behaviour. By shifting the cut-off frequency of a high pass filter according to the above described, the lower frequencies of the audio signals are attenuated progressively with an increasing level of the AF signal compared to the higher components of the audio signal.

Figure 3A:
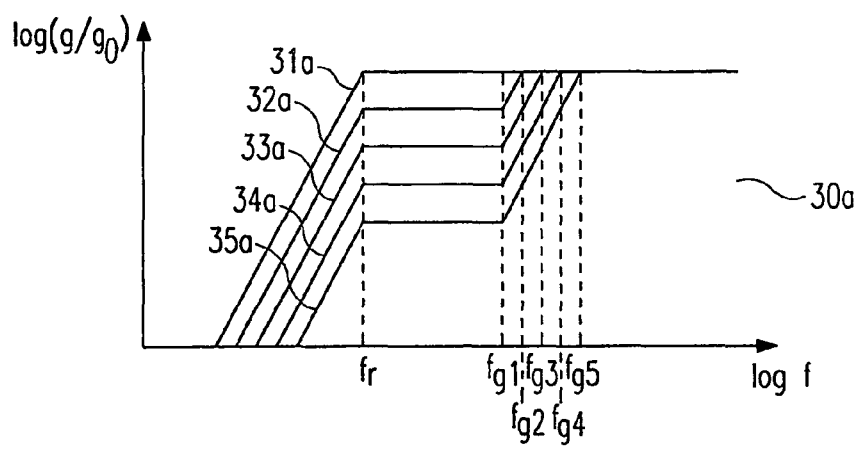
FIG. 3a is a graphical representation of a family of frequency responses achieved with a high pass filter showing a variable gain in its lower frequency range.

In an alternative approach, a high pass filter is used in combination with an equalizer filter allowing to adjust the gain in the lower frequency range of the filter combination. The frequency ranges of both filters overlap in the lower frequency range of the audio signal. A family of frequency responses for a first example of a respective filter combination is shown in FIG. 3a. The cut-off frequency of the high pass filter is set approximately to the resonant frequency $f_r$ of the electrodynamic transducer. The gain of the equalizer filter, which is constant across a lower portion of its frequency range, is set to a value of 1 for low level AF signals. For signal strength information representing an audio signal level above a critical threshold, the low frequency gain of the equalizer filter is continuously being decreased. The frequency responses shown in FIG. 3a refer to gain factors of $g_1=1$, $g_2$, $g_3$, $g_4$, and $g_5$. By reducing the low frequency gain factors of the equalizer filter, the cut-off frequency of the filter combination is shifted to higher frequencies. Line 31a representing a gain factor of about 1 shows a cut-off frequency $f_{g1}$ which is approximately equal to the resonant frequency of the electrodynamic loudspeaker. The frequency response line 32a representing a gain factor $g_2$ shows an edge frequency $f_{g2}$ at a significantly higher value, line 33a representing the frequency response for a gain factor $g_3$ a even higher edge frequency $f_{g3}$, line 34a representing the frequency response for a gain factor $g_4$ a even higher edge frequency $f_{g4}$, and the frequency response curve 35a shows the highest edge frequency $f_{g5}$.

Figure 3B:
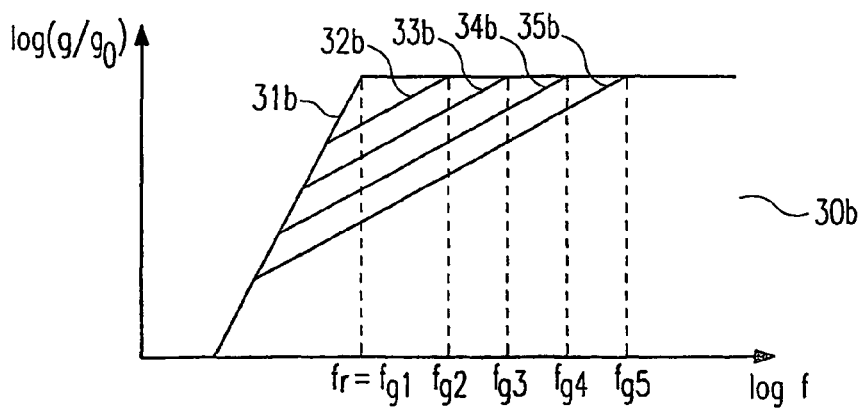
FIG. 3b is a graphical representation of a family of frequency responses for a high pass filter with a variable, with frequency gradually increasing gain in its lower frequency range.

Alternatively hereto, a shallow high pass filter with a frequency response shown in FIG. 3b can be used. Like for the filter combination described above, the edge frequency of the filter combination is shifted to higher frequencies for a signal strength information relating to an increased AF signal level, so that the lower frequencies of an audio signal can be attenuated effectively for higher levels of the audio signal. The cut-off steepness of the filter combination can be varied by varying the edge frequency of the shallow high pass filter. The thus achieved gradual transition from the high to the low frequency range of the filter combination renders a smooth transition in the modification of the AF signal frequency response hereby improving the sound quality.

Figure 4A:
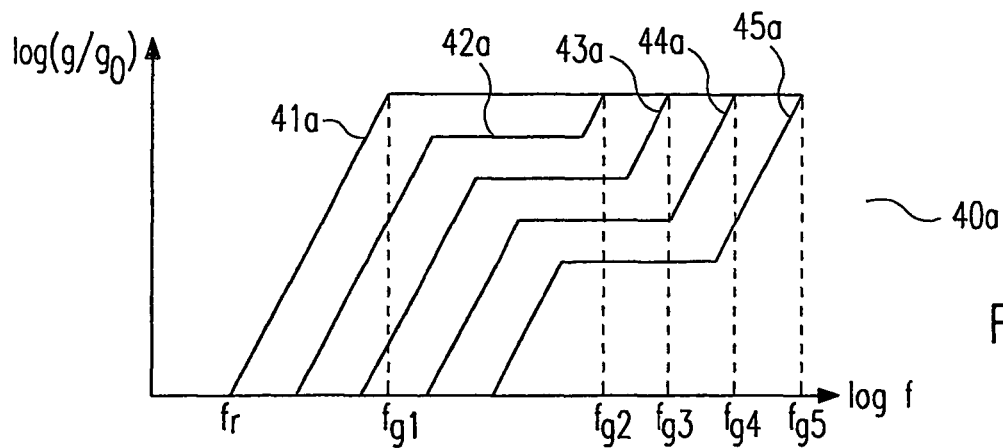
FIG. 4a shows a family of frequency responses for a high pass filter combining a relocatable cut-off frequency with an variable gain in its lower frequency range.
Figure 4B:
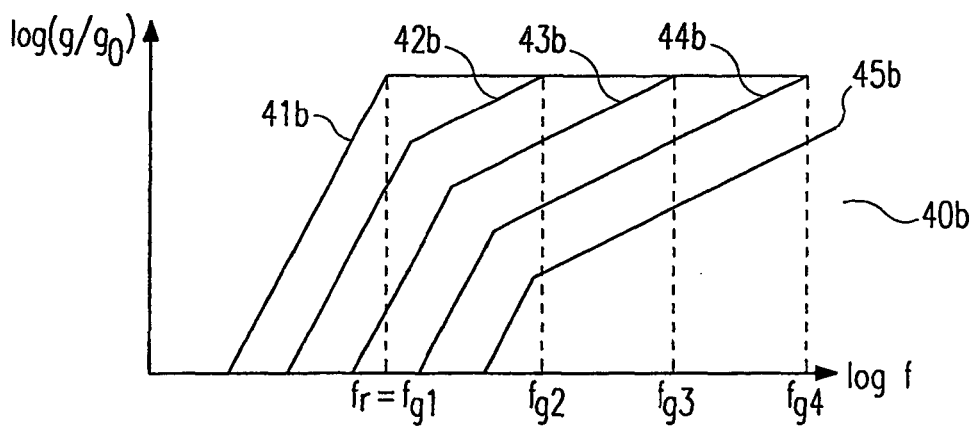
FIG. 4b shows a family of frequency responses of a high pass filter with relocatable cut-off frequency and a variable and with frequency increasing gain in the lower frequency range.

FIGS. 4a and 4b show the family of frequency responses for filter combinations using a high pass filter with adjustable cut-off frequency like that of FIG. 2 with an equalizer or shallow high pass filter according to FIG. 3a or FIG. 3b, respectively. These combinations allow to adjust the signal level of the lower frequency range of the audio signal to values which are safe for the electrodynamic transducer used without cutting off the lower frequencies completely. The shift of the cut-off frequency ($f_{g1}$ to $f_{g5}$) is in both cases a result of a shift of the cut-off frequency of the high pass filter superimposed by a variation of the equalizer or shallow high pass filter gain or edge frequency, respectively, as can be seen from the frequency response lines 41a to 45a and 41b to 45b. The filtering methods described up to now apply particularly for electrodynamic transducers with a low resonant frequency like e.g. around 500 $s^{-1}$, which are particularly suited to provide a good sound quality but at comparatively low sound levels as high signal intensities in the frequency range around the resonant frequency would overload the membrane excursion if not treated in a way described.

When an electrodynamic transducer with a resonant frequency of around $1 \cdot 10^3$ $s^{-1}$ is used, the lower frequency range of the audio signal below 1 Kilohertz is attenuated automatically by the transducer, so that practically no risk of overstraining the transducer exists. But at lower levels of an AF signal, not the whole range of the membrane excursion possible is utilised. The unused capability of the transducer can be favourably utilised for extending the transmitted frequency range below the resonant frequency, thus improving the sound quality.

Figure 5A:
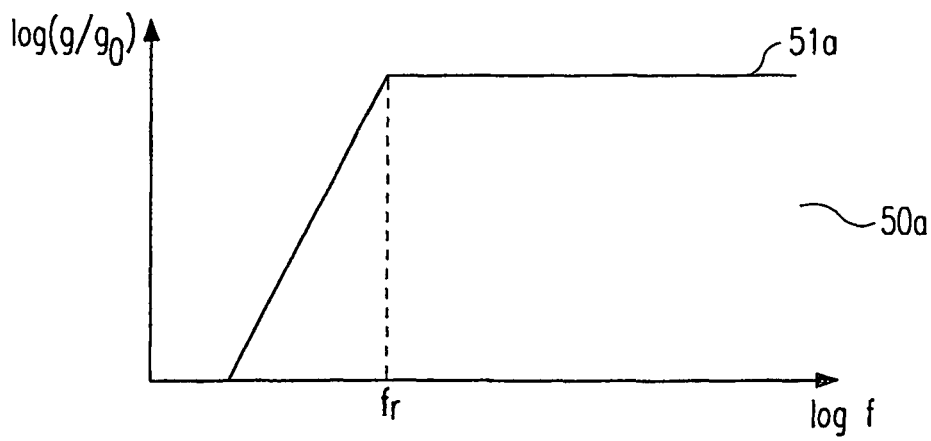
FIG. 5a shows the frequency response of an electrodynamic transducer.
Figure 5B:
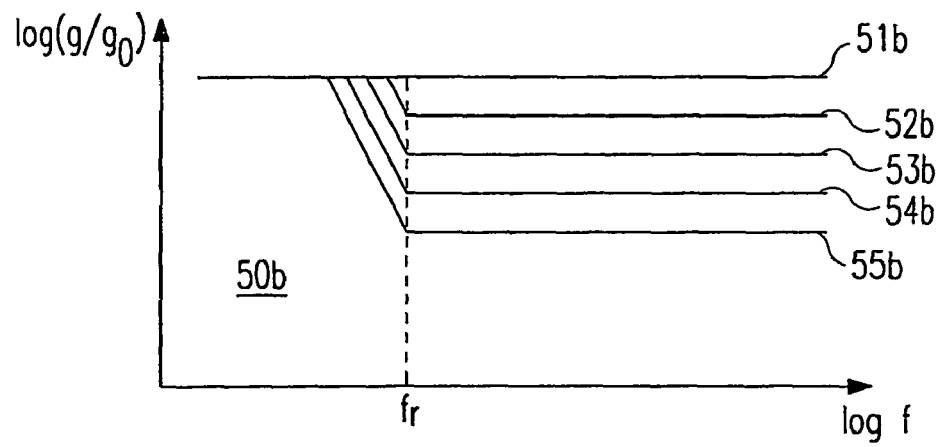
FIG. 5b shows the family of frequency responses of a frequency response modification unit according to the present invention lowering the gain of the higher frequency range of an audio signal with increasing signal strength.
Figure 5C:
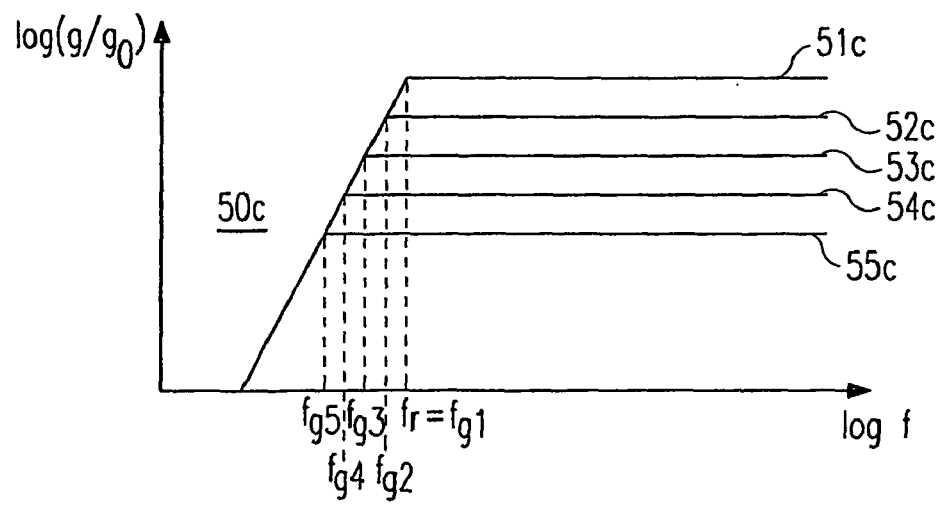
FIG. 5c shows the family of frequency responses obtained for combining an electrodynamic transducer according to FIG. 5a with a frequency response modification means according to FIG. 5b.

For an improved sound quality of a respective audio system with a high resonant frequency transducer, the frequency components of the AF signal below the resonant frequency have to undergo a higher gain than the frequency range above the resonant frequency. The diagram of FIG. 5a shows a frequency response of a transducer with a resonant frequency $f_r$ of for instance $1 \cdot 10^3$ $s^{-1}$. The diagram of FIG. 5b shows a family of frequency response lines 51b to 55b of a filter combination using a low pass or band pass filter for the frequency range below $f_r$ and a high pass filter with a cut-off frequency around the resonant frequency of the transducer $f_r$. The gain of the high pass filter can be reduced according to a reduction of the volume setting. The steepness of the frequency response at the transition from the low pass or band pass filter to the high pass filter is preferably inverse to the cut-off steepness of the transducer's frequency response. The family of frequency responses 51c to 55c for the overall system consisting of the filter combination according to the diagram of FIG. 5b and the transducer according to the diagram of FIG. 5a is shown in the diagram of FIG. 5c. By attenuating the higher frequency range of the AF signal above the resonant frequency $f_r = f_{g1}$ progressively with a decrease of the volume setting or a respective change in the audio signal strength information and retaining the gain below the resonant frequency, the cut-off frequency of the overall audio system is progressively extended to lower frequencies $f_{g2}$ till $f_{g5}$ with a reduced level of the audio signal, resulting in a flat frequency response improving the sound quality of the overall system. The same result can also be obtained with any filter or combination of filters having a family of frequency response lines 51b to 55b.

Alternatively, the frequency range of an audio system using a high resonant frequency transducer may be extended below the resonant frequency of the transducer by combining a high pass filter, the gain of which is controlled by a signal strength information particularly related to the high frequency audio signal components with a low pass filter having a gain controlled by a signal strength information exclusively representing the AF signal energy of the lower frequency portion, i.e. the frequency range below the resonant frequency of the transducer 4. The signal strength information for the higher frequencies may preferably be obtained from the volume setting on the respective device, while that for the lower frequencies is either a constant or is evaluated and provided by an appropriate level determination unit 2 evaluating the level of the audio signal portion below the aforementioned resonant frequency.

A first example for a frequency response behaviour of a respective filter combination with the low pass filter operated at constant gain is shown in FIG. 5b. For a signal strength information representing a high audio output level, a flat response according to line 51b is obtained. When the signal strength information for the higher frequency portion changes according to a decreasing level of this signal portion, a frequency response like e.g. that of line 52b is obtained. For even lower levels of the high frequency signal portion, the frequency response of the filter combination will be close to or like one of the lines 53b to 55b. By combining this family of frequency responses 51b to 55b with the frequency response line for the transducer of FIG. 5a, a family of frequency response lines 51c to 55c shown in FIG. 5c is obtained for the overall audio system. As the steepness of the high pass filter is inversely proportional to the edge of the transducer's frequency response, the edge frequency of the overall audio system is shifted to lower frequencies for lower sound levels thereby improving the sound quality of the system.

Figure 5D:
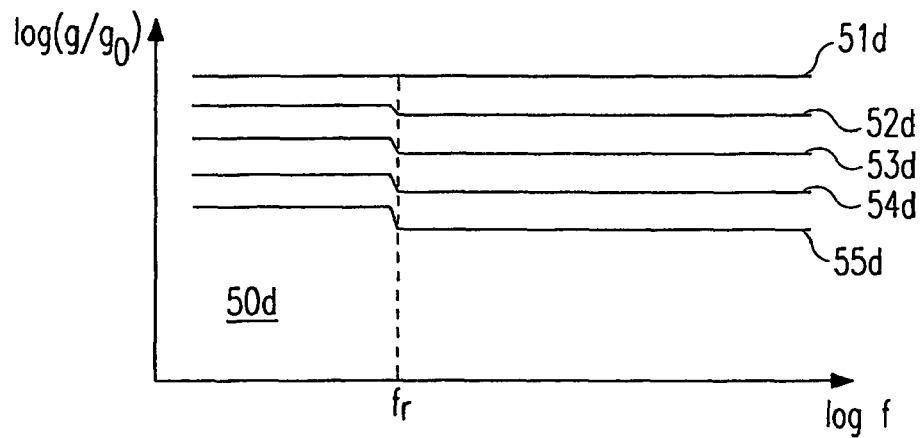
FIG. 5d shows the family of frequency responses of a frequency response modification unit according to the present invention lowering the gain of the lower frequency range to a lesser extend than that of the higher frequency range of an audio signal with decreasing signal strength.

A second example for a frequency response behaviour of a respective filter combination having the gain of the low pass filter controlled by the signal strength information representing the low frequency portion of the AF signal is shown in FIG. 5d. While the gain of the filter combination above the resonant frequency of the transducer is set according to the reading of the volume setting, the gain of the audio signal's frequency components below the resonant frequency is adjusted according to the energy content or the amplitude of the audio signal. The respective signal strength information therefore consists of two values, a first one for controlling the frequencies above the resonant frequency of the transducer and a second one for controlling the frequencies below that resonant frequency. Both values are determined independent from each other, the first one from a reading of the volume setting, the second one from a signal strength evaluation.

Figure 5E:
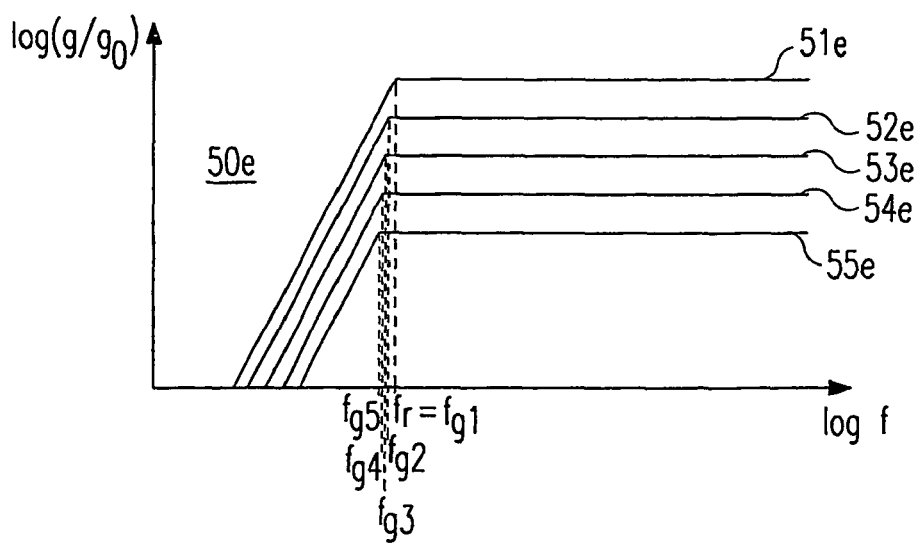
FIG. 5e shows the family of frequency responses obtained for combining an electrodynamic transducer according to FIG. 5a with a frequency response modification means according to FIG. 5d.

For shifting the edge frequency of the overall audio system to lower frequencies at reduced volume settings, the gain of the low frequency signal portion below the resonant frequency of the transducer is preferably regulated in such a way that its value is set somewhat higher than that of the frequencies above that resonant frequency. The difference in the gain of the two filter sections may further be increased with a decreasing overall gain of the filter combination. This is illustrated by the frequency response lines 51d to 55d for the filter combination. As the steepness of the edge between the two filter sections is advantageously inversely proportional to the steepness of the transducers frequency response, the frequency range of the overall audio system is flatly extended to lower frequencies as can be seen from the frequency response lines 51e to 55e in FIG. 5e, which are obtained by combining line 51a of FIG. 5a with the respective lines 51d to 55d of FIG. 5d.

The principles of the invention have been described with respect to a transducer having a resonant frequency close to the lower range and a transducer having a resonant frequency in the mid-range of the audio frequency band. In practice, the described adaptation processes can also be used in combination with an electrodynamic transducer showing a resonant frequency between the two extremes. Combining both adaptation processes means on the one hand that the lower frequency contents of an audio signal will be attenuated when the signal strength information derived from these components reach a certain threshold above which signal distortions have to be expected, and on the other hand it means that the gain of the lower frequency components of the audio signal will be increased when the signal strength information indicates a reduction of the level of the audio signal.

In a preferred embodiment of the present invention a filter combination comprising an equalizer and a high pass filter, both with adjustable gain, is used to adapt an AF signal to the electro-mechanical properties of an electrodynamic transducer of a mobile telecommunication terminal. The cut-off frequency of the high pass filter can thereby preferably be shifted in accordance to an increase or decrease of the level of an AF signal as indicated in FIG. 2.

The steepness of any of the filter edges of the filters described above is preferably proportional or inversely proportional to the square of the frequency as this reflects the low end slope of the speaker frequency response.

Figure 6:
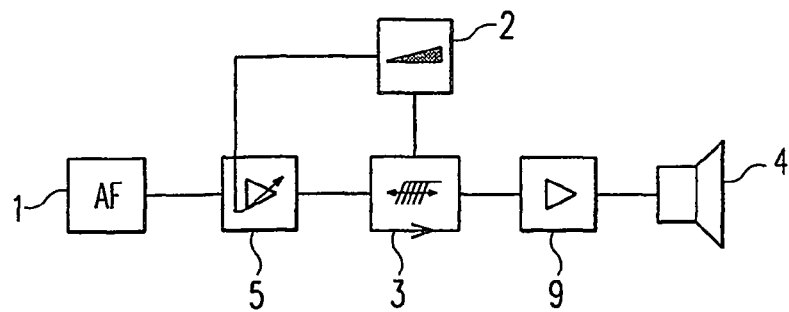
FIG. 6 is a block-schematic circuit diagram with an adaptive modification of a signal frequency response based on a volume setting on the mobile telecommunication terminal.

The block-schematic circuit diagram of a first example of the present invention is shown in FIG. 6. The AF signal provided from the audio signal source 1 of a mobile telecommunication terminal is supplied to an adjustable amplifier 5, the gain of which is set by a user by means of a volume control 2. The output signal of the adjustable amplifier 5 is supplied to the frequency response modification unit 3 for adapting the frequency response of the amplified AF signal to the electromechanical properties of the electrodynamic transducer 4, which converts the output of the modifying unit 3 after amplification in power amplifier 9 into an audible sound signal. The frequency response modifying unit 3, or briefly modifying unit 3, houses a controllable filter element with a frequency response behaviour according to one of the representations of FIGS. 2 to 5. The setting of the volume control 2 serves as a measure for the AF signal intensity, and is supplied to a control port of the modifying unit 3 for adjusting the frequency response modification. As the membrane excursion of the electrodynamic transducer 4 is approximately inversely proportional to the square of the frequency, the cut-off frequency of the high pass filter in the modifying unit 3 is preferably shifted proportional to the square root of the gain set in the adjustable amplifier 5.

Figure 7:
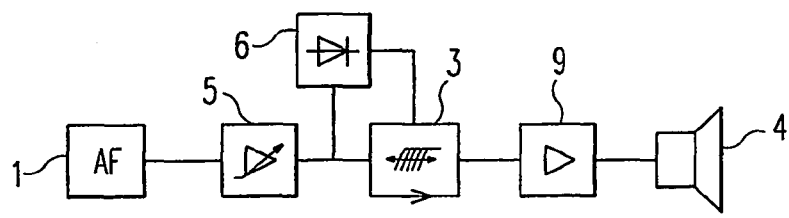
FIG. 7 is a block-schematic circuit diagram of an adaptive modification of a signal frequency response based on a current level determination of an audio signal as a whole.

The block-schematic circuit diagram of FIG. 7 shows a further control circuit according to the present invention having an automatic signal strength information determination. An AF signal originating from the audio signal source 1 undergoes an amplification by adjustable gain amplifier 5, the output of which is connected to the modifying means 3 wherein the signal is adapted to the electro-mechanical properties of the electrodynamic transducer 4. The respective loudspeaker 4, driven by power amplifier 9 finally transduces then the processed signal into a respective sound signal. The output signal of the adjustable gain amplifier 5 is further supplied to the input of a level meter 6 which produces an output signal proportional to the actual signal amplitude measured. The output signal of the level meter 6 is then supplied as a control signal to the control port of the modification unit 3 to effect the required modification of the AF signal. This control signal generated by the level meter 6 may either be based on the peak amplitude or on the root mean square (rms) value of the AF signal. As the membrane excursion of the electrodynamic transducer 4 is approximately inversely proportional to the square of the frequency, the filter element's cut-off frequency is preferably shifted proportional to the square root of the peak or rms value of the signal.

Figure 8:
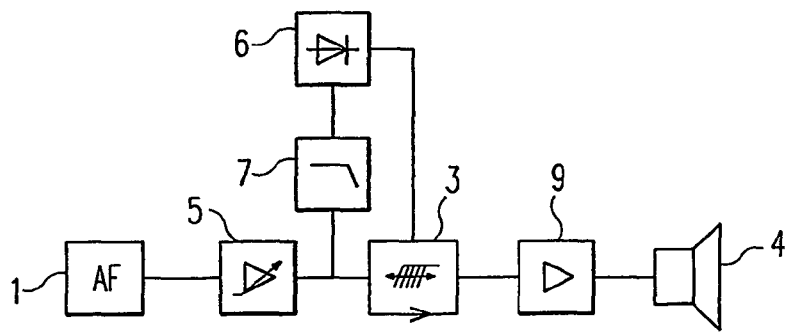
FIG. 8 is a block-schematic circuit diagram of an adaptive modification of a signal frequency response based on a current signal strength information determination of a lower frequency range of the audio signal.

The risk of overloading the electrodynamic transducer 4 is mainly present at the lower frequency part of the AF signal around the resonant frequency of the transducer. A determination of an actual audio frequency level may therefore be favourably restricted to its lower frequency region. This can be accomplished by a low pass filtering of the AF-signal with an appropriate low pass filter 7. The thus filtered AF signal is then supplied to the level meter 6 as shown in the block-schematic circuit diagram of FIG. 8.

Figure 9:
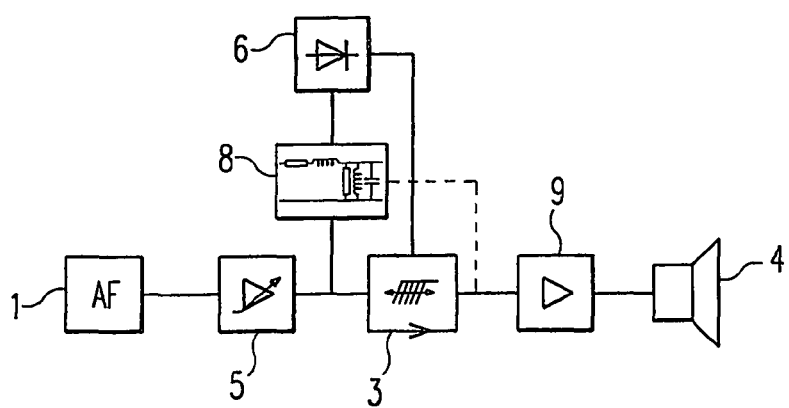
FIG. 9 is a block-schematic circuit diagram of an adaptive modification of a signal frequency response weighting the audio signal according to the electro-mechanical properties of the electrodynamic transducer used.

FIG. 9 shows the block-schematic circuit diagram of a further preferred control circuit according to the present invention. The automatic adaptation of the frequency response of an AF signal to the electro-mechanical properties of an electrodynamic transducer 4 is hereby based on a modelling of a transducer membrane oscillation behaviour. A filter means 8 preceding the level meter 6 is put to this effect in the control path of the circuitry. The frequency response of the filter means 8 conversely reproduces the frequency dependence of the membrane oscillation amplitude. The AF signal is thus weighted according to the electro-mechanical properties of the electrodynamic transducer 4, and the signal strength information determined by the subsequent level meter 6 corresponds exactly to the membrane excursion. The filter means 8 may model the oscillation amplitude behaviour by means of analogue or digital filtering implemented with discrete or integrated circuit elements. In order to establish a control loop for the limitation of the membrane excursion, the signal provided to the input of the filter means 8 may also be derived from the output of the modification unit 3.

The signal level determination means 6 may be integrated in the filter means 8 as indicated by the dashed line in FIG. 9. It may consist of analogue or digital calculations means to predict the expected membrane excursion according to the electro-mechanical properties of the electrodynamic transducer. The modifying means 3 is then set by the filter means 8 such, that a predefined range of the membrane excursion is not exceeded.

All filter elements of the proposed control circuit like for instance the frequency response modification unit 3, the low pass filter 7 or the filtering means 8 may be implemented by analogue circuitry or by digital signal processing.

Figure 10:
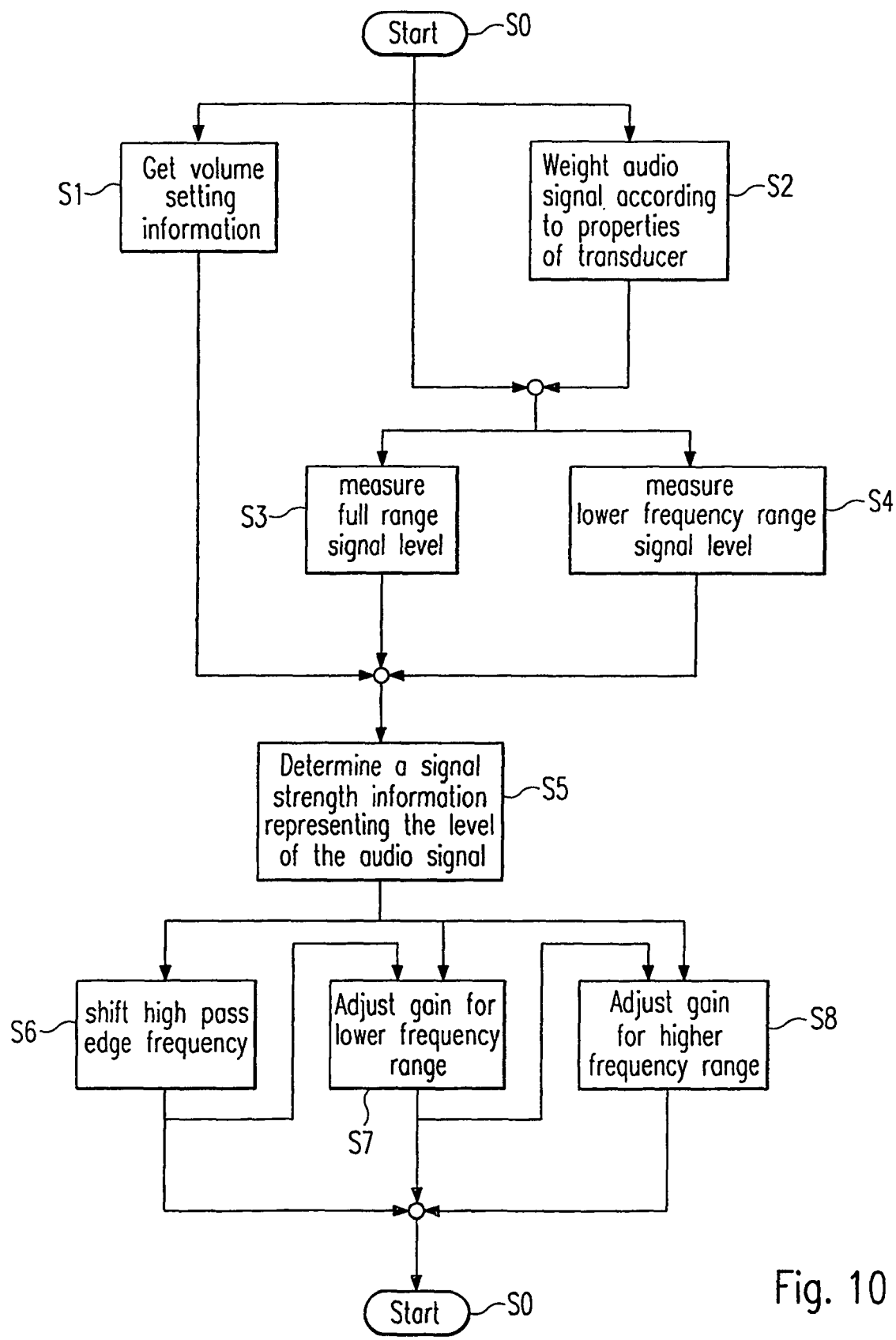
FIG. 10 is a flowchart illustrating operations according to some embodiments of the present invention.

The method for a level dependent frequency selective adaptation of an audio signal to the electro-mechanical properties of an electrodynamic transducer which is carried out by the above explained examples, is illustrated in form of a flow chart in FIG. 10. The procedure starts with step S0. In a first step S1 of the procedure, a volume setting information is obtained. The obtained information about the volume setting is then used in a further step S5 to determine a signal strength information representing the level of the audio signal. alternatively to step S1, the audio signal can be weighted according to the properties of the transducer in step S2, by for instance modifying the frequency distribution of the audio signal with respect to the level reading obtained for the audio signal. Either the weighted audio signal obtained in step S2 or the unprocessed audio signal from step S0 are then used to determine the level of the (weighted) audio signal for the full signal range in a succeeding step S3 or to determine the level of the (weighted) audio signal for its lower frequency range in a succeeding step S4. The level of the (weighted) audio signal obtained in steps S4 or S5 can then be used in step S5 to determine a signal strength information representing the level of the audio signal. It is to be noted that the step S2 corresponds to the embodiment of the present invention explained with reference to FIG. 9.

With a signal strength information value determined in step S1, the frequency distribution of the audio signal is modified based on the obtained value. Principally, the lower frequency range of the audio signal is hereby treated with a gain different to the gain for its higher frequency range, whereby the frequency separating the lower frequency range from the higher frequency range of the audio signal is shifted towards higher values for an increasing level of the audio signal, and towards lower values for a decreasing level of the audio signal. This may be effected by shifting the edge frequency of a high pass filter up or down for increasing or decreasing values of the audio signal respectively in step S6, or by appropriately adjusting the gain for the lower frequency range in step S7, or by modifying the frequency distribution of the audio signal by adjusting the gain for the higher frequency range in step S8. Each of the steps S6, S7 and S8 can be performed directly after step S5, or steps S6 and S7 or steps S6, S7 and S8 can be performed one after another. Either after step S6, or step S7, or step S8, the procedure returns to step S0.

Alternatively, the method will modify the frequency distribution of the audio signal by adjusting the gain for the higher frequency range in step S9. A step which can also be combined with the aforementioned step S7, thus resulting in one of the frequency responses shown in FIG. 5*d* to 5*f*.

The technical implementation of the method according to FIG. 10 may be realised by a circuitry according to one of FIG. 6 to 9 or by a software stored in a storage means of an appliance with a respective audio system when being executed by a processing unit of the appliance. When the software is executed by the processing unit, the method explained above is carried into effect whereby the underlying switching operations reproduce the properties of the aforementioned circuitry.

The present invention is particularly useful for improving the sound quality of mobile telecommunication devices using small electrodynamic transducers.

The invention claimed is:

1. A control circuit for a signal strength information dependent frequency response adaptation of an audio signal for an electrodynamic transducer, the circuit comprising:
   a signal strength information determination means for determining a signal strength information according to a level of the audio signal, and
   a frequency modifying means for selectively modifying the audio signal in response to the signal strength information to adapt the frequency response of the audio signal to the electromechanical properties of the electrodynamic transducer such that the electrodynamic transducer converts the audio signal into a low distortion sound signal for high levels of the audio signal and has a flat frequency response for low levels of the audio signal,
   wherein a lower frequency range of the audio signal is modified with a gain that is different than a gain of a higher frequency range of the audio signal, and a cutoff frequency separating the lower frequency range from the higher frequency range is shifted towards higher values for an increasing level of the audio signal and towards lower values for a decreasing level of the audio signal, the cutoff frequency being the same or lower than a resonant frequency of the electrodynamic transducer for low-level audio signals.

2. A control circuit according to claim 1, wherein the modifying means comprises a high-pass filter, the cut-off frequency of which is shifted towards higher frequencies for increasing levels of the audio signal and is shifted towards lower frequencies for decreasing levels of the audio signal.

3. A control circuit according to claim 2, wherein the cut-off frequency of the high pass filter is shifted proportional to a square root of a peak amplitude of the audio signal.

4. A control circuit according to claim 2, wherein the cut-off frequency of the high pass filter is shifted proportional to a square root of a root mean square value of a frequency of the audio signal.

5. A control circuit according to claim 1, wherein the level of the audio signal is determined by a volume setting.

6. A control circuit according to claim 1, wherein the level of the audio signal is determined from a current amplitude or from a current energy content of the audio signal with respect to a full frequency range of the audio signal.

7. A control circuit according to claim 1, wherein the level of the audio signal is determined from a current amplitude or from a current energy content of a lower frequency range of the audio signal.

8. A control circuit according to claim 1, wherein the modifying means comprises a frequency range selective gain control for decreasing the gain of the higher frequency range of the audio signal corresponding to a decrease in a volume setting of the audio signal.

9. A control circuit according to claim 8, wherein the gain of the modifying means in the lower frequency range of the audio signal is independent of a volume setting of the audio signal.

10. A control circuit according to claim 9, wherein the gain of the modifying means in the lower frequency range of the audio signal has a constant value or decreases for a decreasing level of the audio signal, the gain in the lower frequency range being higher than the gain for the higher frequency range of the audio signal.

11. A control circuit according to claim 1, wherein the modifying means comprises a frequency range selective gain control for decreasing the gain of the lower frequency range of the audio signal corresponding to an increase in the level of the audio signal.

12. A control circuit according to claim 1, wherein the level of the audio signal is determined according to electro-mechanical properties of the electrodynamic transducer.

13. A control circuit according to claim 1, wherein a cut-off steepness of a filter and/or of a frequency range progresses approximately with the square of the frequency.

14. A method for a signal strength information dependent frequency response adaptation of an audio signal for an electro-dynamic transducer, the method comprising:
   determining a signal strength information according to a level of the audio signal using a control circuit, and
   selectively modifying a frequency of the audio signal in response to the signal strength information to adapt the frequency response of the audio signal to the electromechanical properties of the electrodynamic transducer such that the electro-dynamic transducer converts the audio signal into a low distortion sound signal for high levels of the audio signal and has a flat frequency response for low levels of the audio signal using the control circuit,
wherein a lower frequency range of the audio signal is modified with a gain that is different than a gain of a higher frequency range of the audio signal, and a cutoff frequency separating the lower frequency range from the higher frequency range is shifted towards higher values for an increasing level of the audio signal and towards lower values for a decreasing level of the audio signal, the cutoff frequency being the same or lower than a resonant frequency of the electrodynamic transducer for low-level audio signals.

15. A method according to claim 14, comprising determining the level of the audio signal based on a volume setting.

16. A method according to claim 14, comprising determining the level of the audio signal from a current amplitude or from a current energy content of the audio signal with respect to a full frequency range of the audio signal.

17. A method according to claim 14, comprising determining the level of the audio signal from a current amplitude or from a current energy content of a lower frequency range of the audio signal.

18. A method according to claim 14, comprising shifting the cut-off frequency separating the lower frequency range from the higher frequency range proportional to a square root of a peak amplitude of the audio signal.

19. A method according to claim 14, comprising shifting the cut-off frequency separating the lower frequency range from the higher frequency range proportional to a square root of a root mean square value of a frequency of the audio signal.

20. A method according to claim 14, comprising decreasing the gain of the higher frequency range of the audio signal corresponding to a decrease in a volume setting of the audio signal.

21. A method according to claim 20, wherein the method comprises a step for controlling the gain in the lower frequency range of the audio signal independent of the volume setting.

22. A method according to claim 21, wherein the method comprises a step for adjusting the gain in the lower frequency range of the audio signal at a constant value or by decreasing the value of the gain for an increasing level of the audio signal, whereby the gain of the lower frequency range of the audio signal is adjusted to a higher value than that for the higher frequency range of the respective audio signal.

23. A method according to claim 14, comprising decreasing the gain of the lower frequency range of the audio signal corresponding to an increase in the level of the audio signal.

24. A method according to one of the claim 14 wherein the method comprises a step for weighting the level and the frequency distribution of the audio signal according to the electro-mechanical properties of the electro-dynamic transducer (4).

25. A method according to claim 14, comprising controlling a transition in the gain from the lower frequency range to the higher frequency range such that a steepness of the transition is set approximately proportional to a square of the frequency.

26. A computer software product for use on an audio system, the computer program product comprising:
   a computer readable medium having computer readable program code embodied therein, the computer readable program code comprising:
   computer readable program code configured to determine a signal strength information according to a level of the audio signal, and
   computer readable program code configured to selectively modify a frequency of the audio signal in response to the signal strength information to adapt the frequency response of the audio signal to the electromechanical properties of the electrodynamic transducer such that the electro-dynamic transducer converts the audio signal into a low distortion sound signal for high levels of the audio signal and has a flat frequency response for low levels of the audio signal,
wherein a lower frequency range of the audio signal is modified with a gain that is different than a gain of a higher frequency range of the audio signal, and a cutoff frequency separating the lower frequency range from the higher frequency range is shifted towards higher values for an increasing level of the audio signal and towards lower values for a decreasing level of the audio signal, the cutoff frequency being the same or lower than a resonant frequency of the electrodynamic transducer for low-level audio signals.

27. A mobile telecommunication terminal comprising a control circuit for a signal strength information dependent frequency response adaptation of an audio signal for an electrodynamic transducer, the control circuit of the mobile telecommunications terminal comprising:
   a signal strength information determination means for determining a signal strength information according to a level of the audio signal, and
   a frequency modifying means for selectively modifying the audio signal in response to the signal strength information to adapt the frequency response of the audio signal to the electromechanical properties of the electrodynamic transducer such that the electrodynamic transducer converts the audio signal into a low distortion sound signal for high levels of the audio signal and has a flat frequency response for low levels of the audio signal, wherein a lower frequency range of the audio signal is modified with a gain that is different than a gain of a higher frequency range of the audio signal, and a cutoff frequency separating the lower frequency range from the higher frequency range is shifted towards higher values for an increasing level of the audio signal and towards lower values for a decreasing level of the audio signal, the cutoff frequency being the same or lower than a resonant frequency of the electrodynamic transducer for low-level audio signals.

* * * * *